United States Patent [19]
Takahashi et al.

[11] Patent Number: 5,847,570
[45] Date of Patent: Dec. 8, 1998

[54] LOW JITTER TRIGGER CIRCUIT FOR ELECTRO-OPTIC PROBING APPARATUS

[75] Inventors: Hironori Takahashi; Takuya Nakamura, both of Hamamatsu, Japan

[73] Assignee: Hamamatsu Photonics K. K., Hamamatsu, Japan

[21] Appl. No.: 693,969

[22] Filed: Aug. 7, 1996

[30] Foreign Application Priority Data

Aug. 10, 1995 [JP] Japan ................................. 7-204415

[51] Int. Cl.[6] ................................................. G01R 31/308
[52] U.S. Cl. ......................... 324/753; 327/113; 327/184
[58] Field of Search ................................. 327/113, 114, 327/184; 324/753, 158.1

[56] References Cited

U.S. PATENT DOCUMENTS

| | | | |
|---|---|---|---|
| 4,129,828 | 12/1978 | Jindrick | 324/379 |
| 4,513,249 | 4/1985 | Baghdady | 327/356 |
| 5,057,771 | 10/1991 | Pepper | 324/158 |
| 5,422,584 | 6/1995 | Waters | 327/113 |
| 5,422,594 | 6/1995 | Liao et al. | 327/120 |
| 5,495,202 | 2/1996 | Hsu | 327/113 |
| 5,598,440 | 1/1997 | Domagala | 375/329 |

FOREIGN PATENT DOCUMENTS

| | | |
|---|---|---|
| 357440 | 3/1990 | European Pat. Off. . |
| 62-73314 | 4/1987 | Japan . |

OTHER PUBLICATIONS

Hsiao et al: "Optoelectronic Phase Tracking and Electrooptic Sampling of Free-Running Microwave Signals up to 20 GHz in a Laser-Diode-Based System", IEEE Photonics Technology Letters, vol. 7, Jun. 1995, No. 6, pp. 670–672.

Huang et al: "Broadband and Real-Time Waveform Sampling Using Optic-Microwave Phase-Locking", IEEE MTT-S Digest, vol. 3, 14–18, Jun. 1993, pp. 1387–1390.

Sasaki: "Phase-Lock Scope's Sampling to AC Line", vol. 42, No. 23, Nov. 1994, pp. 118–120.

Takahashi et al., "How the Electro-Optic Probing System Can Contribute to LSI Testing?", 1994 IEEE, IMTC '94, May 10–12, Hamamatsu, pp. 1484–1491.

Weingarten et al, "Picosecond Optical Sampling of GaAs Integrated Circuits", IEEE Journal of Quantum Electronics, vol. 24, No. 2, Feb. 1988, pp. 198–220.

Aoshima et al, "Improvement of the Minimum Detectability of Electro-Optic Sampling by Using a Structurally New Probe", OSA Proceeding on Picosecond Electronics and Optoelectronics, 1991, vol. 9, pp. 64–69 (Month Unavailable).

*Primary Examiner*—Josie Ballato
*Assistant Examiner*—Russell M. Kobert
*Attorney, Agent, or Firm*—Pillsbury Madison & Sutro

[57] ABSTRACT

A trigger circuit is composed of a frequency multiplying portion which receives an electric signal to be measured and multiplies its repetitive frequency so as to output a multiple signal, a comparing portion which receives this multiple signal and outputs a square wave signal corresponding to its value, and a dividing portion which divides the square wave signal so as to output a trigger signal. Accordingly, even when a noise component is superposed on the electric signal to be measured, a trigger signal having little jitter and a repetitive frequency lower than that of the electric signal to be measured is output. Also, the electric field measuring apparatus in accordance with the present invention comprises this trigger circuit and measures, with a highly accurate timing, the electric field of the object to be measured.

7 Claims, 11 Drawing Sheets

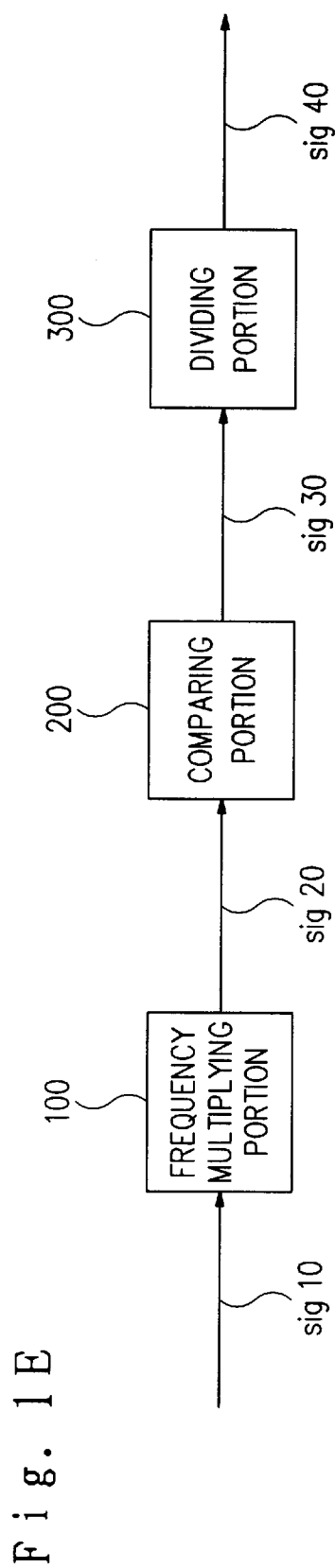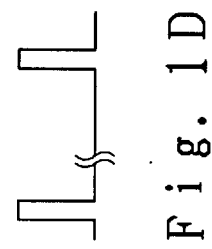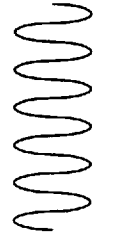

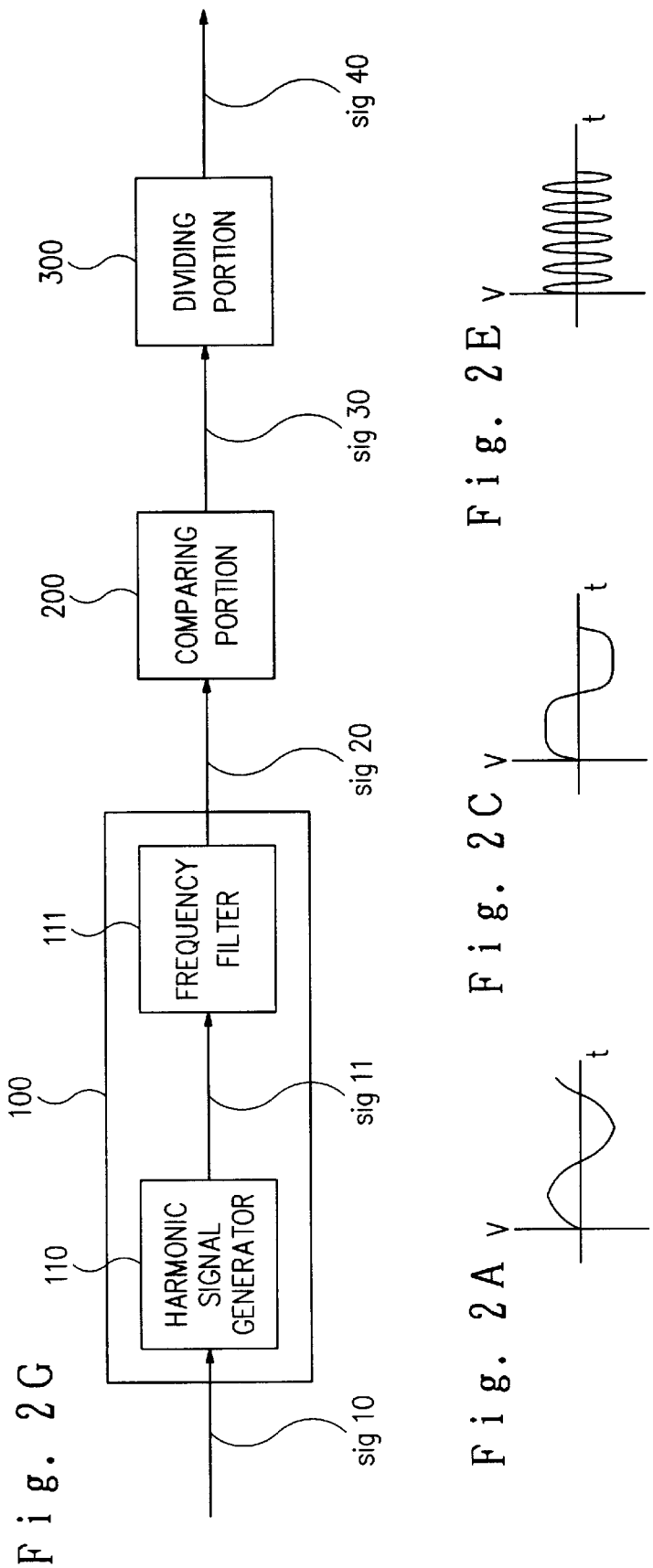

LOW JITTER TRIGGER CIRCUIT FOR ELECTRO-OPTIC PROBING APPARATUS

BACKGROUND OF THE INVENTION

1. Field of the Invention

The present invention relates to a trigger circuit which generates a trigger signal for electric signal waveform measuring apparatuses, such as oscilloscopes, which measure the waveform of electric signals and to a electric field measuring apparatus in which this trigger circuit is preferably used.

2. Related Background Art

An electro-optic probing apparatus is known as an apparatus for detecting an electric field near a device under test by using an electro-optic effect caused by the electric field that exists between the probe and the device. A timebase is used in such an apparatus, and is described in U.S. Pat. No. 5,057,771.

SUMMARY OF THE INVENTION

In an electric signal waveform measuring apparatus such as oscilloscope or electric field measuring apparatus, in order to measure an electric signal waveform, a trigger signal is generated on the basis of this electric signal waveform in the trigger circuit and then the electric signal waveform is measured in synchronization with this trigger signal so as to be displayed on a display portion of the electric signal waveform apparatus.

FIG. 9 is a block diagram of an analog oscilloscope. An electric signal which is an object to be measured and input into the analog oscilloscope is initially input into and amplified by an input amplifying circuit 10 and then input into a CRT driving circuit 12 and a trigger circuit 13. In the trigger circuit 13, a trigger signal is generated on the basis of the output signal from the input amplifying circuit 10, whereas a saw tooth wave synchronized with the trigger signal is generated in a time axis sweep circuit 15. The CRT driving circuit 12 generates a driving signal for a voltage axis direction of a screen of a CRT 16 in proportion to the output signal from the input amplifying circuit 10 and a driving signal for a time axis direction of the screen of a CRT 16 in proportion to the saw tooth wave output from the time axis sweep circuit 15. The CRT 16 displays a spot at a position on its screen indicated by values of these two driving signals output from the CRT driving circuit 12 at each time. Then, since the display position signal for the time axis direction in the screen of the CRT 16 is a saw tooth wave, the waveform of the electric signal to be measured is displayed on the screen of the CRT 16.

The trigger signal generated in the trigger circuit 13 has to be a signal which is correctly synchronized with the electric signal to be measured. If the trigger circuit 13 outputs a trigger signal at a wrong time, the time axis sweep circuit 15 will generate a saw tooth wave from this wrong time, thereby disordering the waveform of the electric signal displayed on the screen of the CRT 16. Namely, whether or not the trigger circuit 13 generates a trigger signal correctly in synchronization with the electric signal greatly influences the performance of the analog oscilloscope.

The driving signals output from the CRT driving circuit 12 have a voltage amplitude of tens to hundreds of volts in both cases of the driving signals for voltage axis direction and time axis direction in the screen of the CRT 16. Accordingly, there is a problem that power consumption and heat generation will become greater as the repetitional frequency of generation of the trigger signal output from the trigger circuit 13 is higher. In order to overcome this problem, a thinning circuit or dividing circuit for thinning out the trigger signal has been added to the trigger circuit 13 or the time axis sweep circuit 15 so as to reduce the repetitional frequency at which the electric signal waveform is displayed on the screen of the CRT 16 (e.g., Japanese Unexamined Patent Publication Sho No. 62-073314).

FIG. 10 is a block diagram of a digital oscilloscope. Also in the digital oscilloscope, a trigger circuit 13 generates a trigger signal in synchronization with the waveform of an electric signal to be measured. A timing control circuit 14 generates a timing signal based on this trigger signal. Then, based on this timing signal, a memory circuit 11 stores the electric signal waveform or transmits the stored electric signal waveform to a CRT driving circuit 12, whereas a time axis sweep circuit 15 generates a saw tooth wave and transmits it to the CRT driving circuit 12. In the digital oscilloscope, as in the case of the analog oscilloscope, the trigger signal generated in the trigger circuit 13 has a very important role when the electric signal is displayed on the screen of the CRT 16.

A comparator is used in a trigger circuit in order to generate a trigger signal from an input electric signal waveform. FIG. 11 is a symbolic diagram for explaining the principle of operation of a comparator.

A comparator 13A compares the magnitudes of $V^+$ and $V^-$ signals, which are respectively input into $V^+$ and $V^-$ terminals, with each other and then, in response to the result of this comparison, outputs $V_{out}$ signal to a $V_{out}$ terminal. The $V_{out}$ signal is an H-level signal when the $V^+$ signal is greater than the $V^-$ signal while otherwise being an L-level signal. Accordingly, assuming that electric signal $V_{in}$ to be measured and reference voltage $V_t$ with a constant value are respectively input to the $V^+$ and $V^-$ terminals, the $V_{out}$ signal becomes the H-level signal when the electric signal $V_{in}$ is greater than the reference voltage $V_t$ while otherwise becoming the L-level signal. Here, when the output of the comparator 13A is of a TTL level, the H level and L level are 5 V and 0 V, respectively. When the output of the comparator 13A is of an ECL level, on the other hand, the H level and L level are −0.8 V and −2 V, respectively. Thus, the comparator 13A can receive the electric signal $V_{in}$, which is an analog signal, and compares the signal level at each time with the reference voltage $V_t$ so as to obtain a digital output corresponding to the result thereof. Namely, the comparator 13A outputs a pulse when the level of the electric signal $V_{in}$ coincides with that of the reference voltage $V_t$. Then, this pulse becomes a trigger signal which is the output of the trigger circuit 13.

The trigger circuit comprising the comparator in the above-mentioned conventional example has problems such as those explained in the following.

FIGS. 12, 13 and 14 are explanatory charts showing the influence of a noise included in an input signal in a conventional circuit upon generation of a trigger signal. The charts (a) to (c) in FIG. 12 show the operation of the trigger circuit in an ideal case where neither the electric signal $V_{in}$ nor the reference voltage $V_t$ input into the comparator of the trigger circuit does not include a noise component; the charts (a) to (c) in FIG. 13 show that in a case where, while the reference voltage $V_t$ does not include a noise component, the noise component is superposed on the electric signal $V_{in}$; and the charts (a) to (c) in FIG. 14 show that in a case where both the electric signal $V_{in}$ and reference voltage $V_t$ include a noise component superposed thereon.

As shown in FIG. 12(a), in the ideal case where neither the electric signal $V_{in}$ nor the reference voltage $V_t$ does not include a noise component, the electric signal $V_{in}$ and the reference voltage $V_t$ coincide with each other at time $t_0$ as the electric signal $V_{in}$ increases from a value lower than the reference voltage $V_t$ to a value higher than the reference voltage $V_t$. Accordingly, as shown in FIG. 12(b), the $V_{out}$ output of the comparator becomes the L level and the H level before and after the time $t_0$, respectively. FIG. 12(c) shows the $V_{out}$ output of the comparator 13A obtained when the above-mentioned operation is performed at a plurality of times. Since the comparator 13A always yields an output only at time $t_0$, (b) and (c) in FIG. 12 coincide with each other.

The chart (a) in FIG. 13 shows a case where, while the reference voltage $V_t$ does not include a noise component, the noise component is superposed on the electric signal $V_{in}$, with its continuous curve indicating the waveform of this electric signal $V_{in}$. Its broken lines indicate the maximum and minimum values of the electric signal $V_{in}$ when this noise component is superposed thereon, within the range of which the input electric signal exists. FIG. 13(b) shows the $V_{out}$ output of the comparator 13A when the electric signal $V_{in}$ indicated by the continuous curve is input, which becomes the H level at time $t_0'$ and thereafter. FIG. 13(c) shows the $V_{out}$ output of the comparator 13A obtained when the above-mentioned operation is performed at a plurality of times. During the period from time $t_1'$ to time $t_2'$, there is a possibility that the electric signal $V_{in}$ and the reference signal $V_t$ may coincide with each other, whereby the $V_{out}$ output of the comparator 13A changes to the H level during this period from time $t_1'$ to time $t_2'$. As a result, the level changing time of the pulse output from the trigger circuit yields a fluctuation of $t_1'$ to $t_2'$, which becomes a jitter of the trigger signal. Here, $t_1'$ is the time when the maximum value of the electric signal $V_{in}$ coincides with the reference voltage $V_t$, whereas $t_2'$ is the time when the minimum value of the electric signal $V_{in}$ coincides with the reference voltage $V_t$.

FIG. 14(a) shows a case where both the electric signal $V_{in}$ and reference voltage $V_t$ include a noise component superposed thereon, with its continuous curves indicating the respective waveforms of the electric signal $V_{in}$ and the reference voltage $V_t$. As in the case of FIG. 13(a), its broken lines indicate the maximum and minimum values of the electric signal $V_{in}$, whereas its alternate long and short dash lines indicate the maximum and minimum values of the reference voltage $V_t$ when the noise component is superposed thereon. FIG. 14(b) shows the $V_{out}$ output of the comparator 13A in the case of the electric signal $V_{in}$ and reference voltage $V_t$ indicated by the continuous curves. Since they coincide with each other at time $t_0''$, the $V_{out}$ output becomes the H level at time $t_0''$ and thereafter. FIG. 14(c) shows the $V_{out}$ output of the comparator 13A obtained when the above-mentioned operation is performed at a plurality of times. Here, $t_1''$ is the time when the maximum value of the electric signal $V_{in}$ coincides with the minimum value of the reference voltage $V_t$, whereas $t_2''$ is the time when the minimum value of the electric signal $V_{in}$ coincides with the maximum value of the reference voltage $V_t$. In this case, during the period from time $t_1''$ to time $t_2''$, there is a possibility that the electric signal $V_{in}$ and the reference signal $V_t$ may coincide with each other, whereby the $V_{out}$ output of the comparator 13A changes to the H level during this period. As a result, the jitter of the trigger signal lies in the time period of $t_1''$ to $t_2''$, which is wider than the time period of $t_1'$ to $t_2'$ obtained when a noise is superposed only on the electric signal $V_{in}$. Namely, jitter becomes greater when a noise exists in both the electric signal $V_{in}$ and the reference voltage $V_t$.

Although the above-mentioned example explains the cases where the electric signal $V_{in}$ increases from a value lower than the reference voltage $V_t$ to that higher than the latter, it similarly applies to cases where the electric signal $V_{in}$ decreases from a value higher than the reference voltage $V_t$ to that lower than the latter.

Thus, in cases where a noise is superposed on the electric signal $V_{in}$ to be measured and further in cases where a noise is also superposed on the reference voltage $V_t$, jitter is generated in the trigger signal output from the trigger circuit.

Also, FIG. 15 is an explanatory chart showing the influence of time change velocity of the electric signal upon generation of the trigger signal in a conventional trigger circuit. Time change velocity η of the electric signal $V_{in}$ is a value obtained at time t0 when the electric signal $V_{in}$ is differentiated by time t and expressed by the following equation:

$$\eta = dV_{in}/dt(t=t0) \tag{1}$$

Time t0 is the time when the electric signal $V_{in}$ and the reference voltage $V_t$ coincide with each other. Here, assuming that the electric signal $V_{in}$ is a sine wave having an amplitude $V_s$ and a frequency f and that the reference voltage $V_t$ is 0 V, it is expressed as follows:

$$V_{in} = V_s \times \sin(2\pi ft) \tag{2}$$

Accordingly, equation (1) becomes:

$$\eta = 2\pi f V_s \tag{3}$$

If a noise component having a maximum amplitude $V_n$ is superposed on the electric signal $V_{in}$ to be measured, the electric signal input into the comparator will be $V_{in} \pm V_n$. Period T during which there is a possibility that the electric signal $V_{in} \pm V_n$ and the reference voltage $V_t$ (assumed to be constant) may coincide with each other is expressed, depending on the time change velocity η of the electric signal $V_{in}$ and the amplitude $V_n$ of the noise component, by an equation as follows:

$$T = 2 \times V_n/\eta \tag{4}$$

When the electric signal is a sine wave expressed by equation (2), expression (4) becomes:

$$T = V_n/(\pi f V_s) \tag{5}$$

Thus, as the amplitude ratio of the noise component $V_n$ to the electric signal $V_{in}$, i.e., $V_n/V_s$, is larger and the time change velocity I of the electric signal $V_{in}$ is smaller, namely, the frequency thereof is lower, a greater jitter is generated in the trigger signal output from the trigger circuit. Then, as such a jitter is generated, the timing for displaying a waveform on a CRT screen may become incorrect, thereby disordering the waveform displayed on the CRT.

In order to decrease the jitter generated in the trigger signal, the amplitude ratio of the noise component to the electric signal $V_{in}$ has to be decreased while the time change velocity η of the electric signal $V_{in}$ has to be increased. However, depending on the objects to be measured, there are cases where the amplitude ratio of the noise component to the electric signal $V_{in}$ is difficult to decrease. In particular, in cases where an inherently weak electric signal is to be measured, even when the electric signal is amplified by an amplifier, the noise component is amplified together with the inherent electric signal. Also, when the amplifier is used, the noise of the amplifier is superposed on the electric signal, thereby increasing the amplitude ratio of the noise component superposed on the electric signal input into the trigger circuit. On the other hand, the time change velocity η of the electric signal $V_{in}$ is determined by the waveform of the electric signal $V_{in}$, so that it is impossible to increase the η value without increasing the amplitude ratio of the noise component.

Accordingly, it has been impossible for the conventional trigger circuit to generate a trigger signal which includes no jitter or little jitter. Therefore, in the electric signal waveform measuring apparatus using such a conventional trigger circuit, when the electric signal to be measured changes with a high speed, its waveform cannot be correctly measured.

In order to overcome the above-mentioned problems, an object of the present invention is to provide a trigger circuit which, in order to correctly measure the waveform of an electric signal of an object to be measured, generates a trigger signal which is correctly synchronized with the electric signal. Another object is to provide an electric field measuring apparatus which can measure an electric field distribution with a high accuracy.

The first trigger circuit comprises (1) a frequency multiplying portion which receives an input signal having a first repetitive frequency and multiplies the repetitive frequency of the input signal so as to output a multiple signal having a second repetitive frequency which is greater than the first repetitive frequency; (2) a comparing portion which receives the multiple signal and outputs a square wave signal which has a first output level when the multiple signal has a value greater than a reference value while otherwise having a second output level which is different from the first output level; and (3) a dividing portion which divides the square wave signal so as to output a trigger signal having a third repetitive frequency which is smaller than the second repetitive frequency.

The first trigger circuit operates as explained in the following. When an input signal having a first repetitive frequency is input into the frequency multiplying portion, the repetitive frequency of this input signal is multiplied such that a multiple signal having a second repetitive frequency greater than the first repetitive frequency is output. Accordingly, a multiple signal having a time change velocity faster than that of the originally input signal is generated. When the multiple signal is input into the comparing portion, a square wave signal which has a first output level when the multiple signal has a value greater than a reference value while otherwise having a second output level which is different from the first output level is output. Accordingly, even when a noise component is superposed on the originally input signal, a square wave signal having less jitter is generated. When the square wave signal is input into the dividing portion, this square wave signal is divided such that a trigger signal having a third repetitive frequency which is smaller than the second repetitive frequency is output. Since thus generated trigger signal has less jitter and a smaller repetitive frequency, the measuring apparatus has a favorable accuracy with less power consumption and heat generation.

In the second trigger circuit, the frequency multiplying portion may comprise (1) a harmonic signal generator which receives the input signal and outputs a harmonic signal having a harmonic frequency component of the first repetitive frequency and (2) a frequency filter which receives the harmonic signal and outputs, as the multiple signal, a signal of a component of the second repetitive frequency contained in the harmonic signal. In this case, a harmonic wave having the harmonic frequency component of the first repetitive frequency of the input signal is generated in this frequency multiplying portion, while the signal of the second repetitive frequency component included in this harmonic signal is output as the multiple signal.

The third trigger circuit may comprise (1) a phase comparator which receives the input signal and a reference signal and detects the phase difference between the input signal and the reference signal so as to output a phase difference signal; (2) an oscillator which receives the phase difference signal and, based on the phase difference signal, controls the repetitive frequency of the multiple signal so as to output the multiple signal; (3) a comparator portion which receives the multiple signal and outputs a reference square wave signal which has a first output level when the multiple signal has a value greater than a reference value while otherwise having a second output level which is different from the first output level; and (4) a divider which receives the reference square wave signal and divides the reference square wave signal with a ratio of the first repetitive frequency to the second repetitive frequency so as to output the reference signal. In this case, a feedback circuit is formed in this frequency multiplying portion. When this feedback circuit attains its stable state, the first repetitive frequency and the repetitive frequency of the reference signal output from the divider coincide with each other, whereby the multiple signal output from the oscillator has the second repetitive frequency.

In the fourth trigger circuit, the third repetitive frequency may be a repetitive frequency smaller than the first repetitive frequency, while the frequency multiplying portion may comprise (1) a phase comparator which receives the input signal and a reference signal and detects the phase difference between the input signal and the reference signal so as to output a phase difference signal and (2) an oscillator which receives the phase difference signal and, based on the phase difference signal, controls the repetitive frequency of the multiple signal so as to output the multiple signal, and the dividing portion may comprise (1) a first divider which receives the square wave signal and divides the square wave signal with a ratio of the first repetitive frequency to the second repetitive frequency so as to output the reference signal and (2) a second divider which receives the square wave signal and divides the square wave signal with a ratio of the third repetitive frequency to the first repetitive frequency so as to output the trigger signal. In this case, the phase comparator, the oscillator, the comparing portion, and the first divider form a feedback circuit. When this feedback circuit attains its stable state, the first repetitive frequency and the repetitive frequency of the reference signal output from the divider coincide with each other, whereby the multiple signal output from the oscillator has the second repetitive frequency.

Also, the fifth electric field measuring apparatus is an electric field measuring apparatus for measuring an electric field of an object to be measured and comprises (a) an electric field sensor composed of an electro-optic material whose optical characteristic changes in response to an electric field strength; (b) a signal source which supplies a driving signal synchronized with a first repetitive frequency to the object to be measured; (c) a trigger circuit which outputs a trigger signal in response to the driving signal; (d) a probe light source which outputs pulse probe light to the electric field sensor when the trigger signal is input; and (e) a light detecting portion which measures reflected probe light which has arrived there from the electric field sensor, while the trigger circuit comprises (1) a frequency multiplying portion which receives a reference signal which is identical to or synchronized with the driving signal and multiplies a repetitive frequency of the repetitive signal so as to output a multiple signal having a second repetitive frequency which is greater than the first repetitive frequency; (2) a comparing portion which receives the multiple signal and outputs a square wave signal which has a first output level when the multiple signal has a value greater than a reference value while otherwise having a second output level which is different from the first output level; and (3) a dividing portion which divides the square wave signal so as to output the trigger signal having a third repetitive frequency which is smaller than the second repetitive frequency.

The fifth electric field measuring apparatus operates as explained in the following. A reference signal identical to or synchronized with the driving signal having the first repetitive frequency supplied from the signal source to the object to be measured is input into the trigger circuit. The repetitive frequency of the reference signal is multiplied such that a multiple signal having the second repetitive frequency in the frequency multiplying portion of the trigger circuit is output, a square wave signal having a less jitter is output from the comparing portion, and a trigger signal having a small repetitive frequency is generated in the dividing portion. The probe light is output from the probe light source based on this trigger signal and output to the electric field sensor composed of an electro-optic material whose optical characteristic changes in response to an electric field strength. Then, the reflected probe light which has arrived there from the electric field sensor is measured by the light detecting portion so as to measure the electric field of the object to be measured. Since the trigger signal output from the trigger circuit has less jitter and the probe light lighting timing is correctly in synchronization with the driving signal generating timing, the electric field strength of the object to be measured can be correctly measured with respect to the driving signal at a predetermined timing.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1A to 1D are timing charts in a trigger circuit in FIG. 1E.

FIG. 1E is a block diagram of the trigger circuit in accordance with the first embodiment.

FIGS. 2A to 2F are timing and frequency chars in a trigger circuit of FIG. 2G.

FIG. 2G is a block diagram of the trigger circuit in accordance with the second embodiment.

DESCRIPTION OF THE PREFERRED EMBODIMENTS

In the following, embodiments of the present invention will be explained in detail with reference to the attached drawings. Here, in the explanation of the drawings, identical elements are referred to with identical marks without repeating their overlapping explanations.

(First Embodiment)

First, the first embodiment will be explained. FIG. 1E is a block diagram of the trigger circuit in accordance with the first embodiment.

The trigger circuit in accordance with this embodiment comprises (1) a frequency multiplying portion 100 which receives an electric signal sig10 to be measured and multiplies the repetitive frequency of this electric signal sig10 so as to output a multiple signal sig20; (2) a comparing portion 200 which receives the multiple signal sig20, compares the magnitudes of this multiple signal sig20 and a reference voltage with each other, and, in response to the result thereof, outputs a square wave signal sig30; and (3) a dividing portion 300 which receives the square wave signal sig30 and decreases the pulse number of this square wave signal sig30 according to a predetermined dividing ratio so as to output a trigger signal sig40.

To the frequency multiplying portion 100, the electric signal sig10 to be measured is input. Alternatively, when this electric signal is weak, an input amplifying circuit is provided in front of the trigger circuit such that the electric signal sig10 amplified by this input amplifying circuit is input into the frequency multiplying portion 100. This electric signal sig10 is a repetitive signal whose value periodically changes (FIG. 1A) and may be either a sine wave or a square wave. The frequency multiplying portion 100 multiplies the repetitive frequency in this electric signal sig10 so as to output the multiple signal sig20 having a higher repetitive frequency (FIG. 1B).

Figure 11:
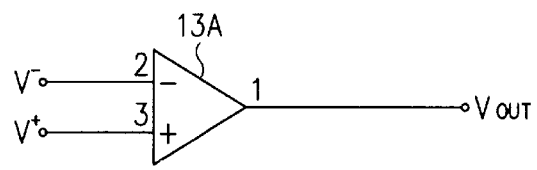
FIG. 11 is a symbolic diagram for explaining the principle of operation of a comparator.
Figure 12:
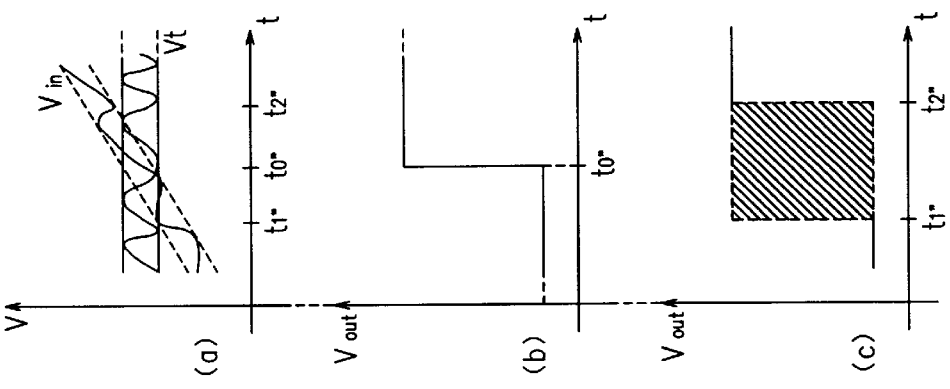
FIG. 12 shows explanatory charts showing the influence of a noise included in an input signal in a circuit upon generation of a trigger signal.
Figure 13:
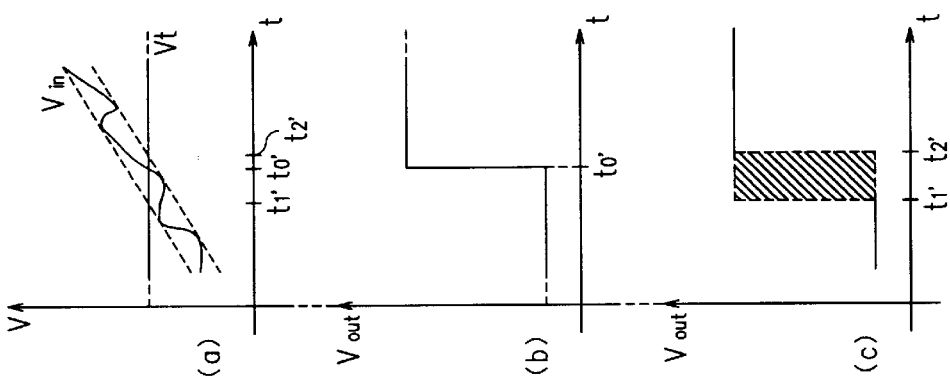
FIG. 13 shows explanatory charts showing the influence of a noise included in an input signal in the circuit upon generation of a trigger signal.
Figure 14:
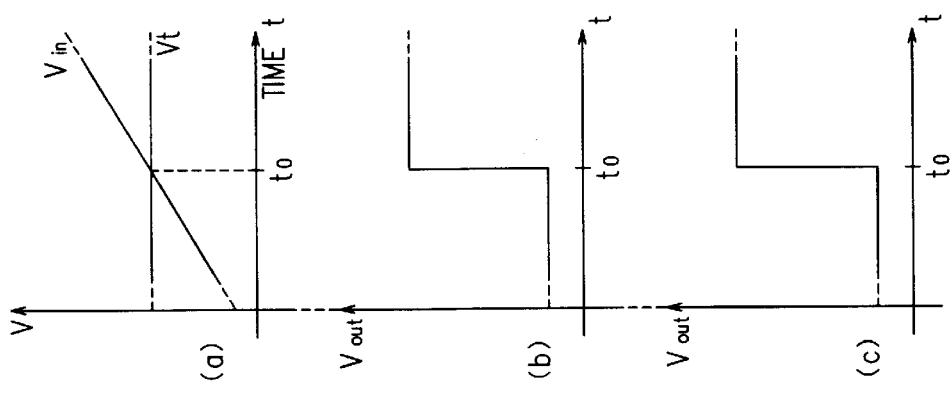
FIG. 14 shows explanatory charts showing the influence of a noise included in an input signal in the circuit upon generation of a trigger signal.
Figure 15:
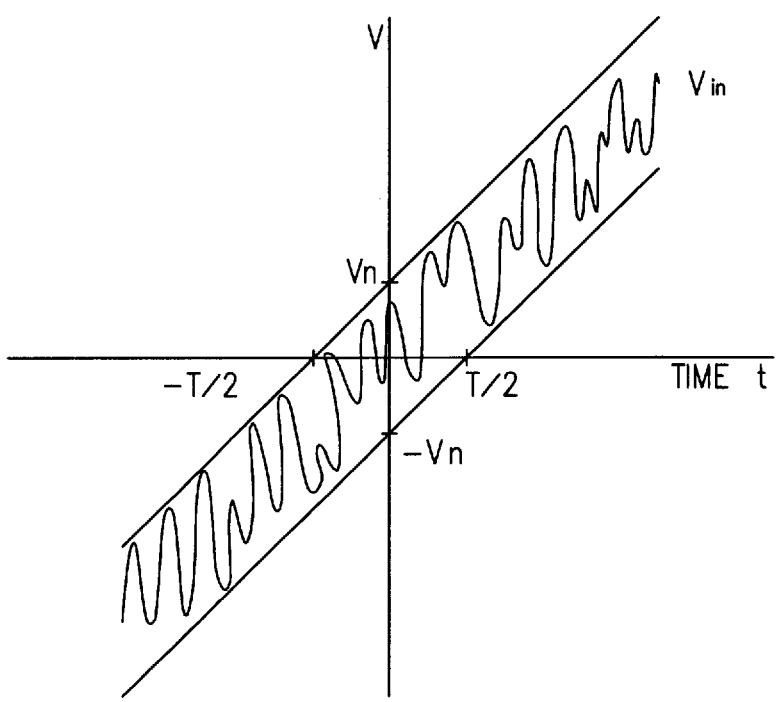
FIG. 15 is an explanatory chart showing the influence of the time change velocity of the electric signal upon generation of the trigger signal in the trigger circuit.

The comparing portion 200 receives the multiple signal sig20 output from the frequency multiplying portion 100, compares this signal with a reference value in terms of their magnitudes, and, in response to the result thereof, outputs the square wave signal sig30 (FIG. 1C). As this comparing portion 200, the comparator shown in the above-mentioned FIG. 11, for example, is used.

The dividing portion 300 receives the square wave signal sig30 output from the comparing portion 200 and thins out the pulses included in this square wave signal sig30 with a predetermined dividing ratio so as to output the trigger signal sig40 (FIG. 1D). Namely, while the trigger signal sig40 is also a square wave, its pulse number is lower than that of the square wave signal sig30 by the predetermined dividing ratio. As the dividing portion 300, a count-down circuit, for example, is used.

Since the trigger circuit in accordance with this embodiment is configured as mentioned above, it operates as explained in the following. For example, it is assumed that the frequency multiplying portion 100 has a multiplying ratio of 10 times and that the amplitude of the input electric signal sig10 and that of the output multiple signal sig20 are equal to each other. Also, it is assumed that the dividing ratio of the dividing portion 300 is $1/100$. Further, it is assumed that the electric signal sig10 to be measured is a sine wave with a frequency of 10 MHz. In this case, when this electric signal sig10 is input into the frequency multiplying portion 100, the latter outputs the multiple signal sig20 which is a sine wave with a frequency of 100 MHz.

When this multiple signal sig20 is input into the comparing portion 200, the latter outputs the square wave signal sig30. As can be seen from equation (5), the jitter generated in this square wave signal sig30 becomes $1/10$ of that in the conventional case where the electric signal sig10 is directly input into the comparing portion 200.

When the square wave signal sig30 is input into the dividing portion 300, the latter outputs one pulse in every 100 pulses of the square wave signal sig30, thereby making the trigger signal sig40. Thus generated trigger signal sig40 is a pulse train of the repetitive frequency which is $1/10$ that of the frequency of the electric signal sig10 which is the object to be measured, whereby the jitter can be reduced to $1/10$ of that in the conventional case. When the trigger circuit of this embodiment is adopted in the above-mentioned analog oscilloscope, such a trigger signal is input into the time axis sweep circuit, whereby the waveform of the electric signal to be measured can be correctly displayed on the CRT screen by the CRT driving circuit. Also, since the number for repeating the displaying operation decreases, the power consumption and heat generation in the driving circuit and the like can be reduced.

While effects similar to those of this embodiment can be obtained from equation (5) in the conventional case when the amplitude $V_s$ of the electric signal to be measured is large, the electric signal rarely has such a large amplitude. When a weak electric signal is amplified so as to input a signal with a large amplitude into the trigger circuit, the noise component superposed on this electric signal is amplified together, whereby the value of equation (5) is not improved at all.

(Second Embodiment)

In the following, the second embodiment will be explained. In this embodiment, a harmonic signal generator is used as a frequency multiplier. FIG. 2G is a block diagram of the trigger circuit in accordance with the second embodiment, and FIGS. 2A to 2F are timing and frequency charts of the signal in the circuit.

The trigger circuit in accordance with this embodiment comprises a frequency multiplying portion 100, a comparing portion 200, and a dividing portion 300 as in the case of the above-mentioned first embodiment, while its frequency multiplying portion 100 comprises (1) a harmonic signal generator 110 which receives an electric signal sig10 which is an object to be measured and generates and outputs a harmonic wave signal sig11 having a harmonic frequency component of this electric signal sig10 and (2) a frequency filter 111 which receives the harmonic signal sig11 and selects a signal of a predetermined repetitive frequency component included in this harmonic signal sig11 so as to be output as a multiple signal sig20.

The harmonic signal generator 110 receives the electric signal sig10 (FIGS. 2A and 2B) which is the object to be measured and generates and outputs the harmonic signal sigh (FIGS. 2C and 2D) which has several harmonic frequency components of this electric signal sig10. The harmonic signal output from the harmonic signal generator 110 includes not only the frequency identical to that of the input electric signal sig10 but also the frequency components which are obtained when this frequency is multiplied by integers. As the harmonic signal generator 110, a high-gain amplifier, for example, is used. In this case, when the signal level of the input electric signal sig10 is high, the output level is placed in its saturated state, whereby the output includes the frequency component of the electric signal sig10 as well as that multiplied by integers.

When the harmonic signal sig11 is input, the frequency filter 111 selectively outputs a signal of a predetermined frequency component (FIG. 2E and 2F) contained in this harmonic wave signal sig11. As the frequency filter 111, a narrow-band amplifier is used, whereby only a desired frequency component is output as the multiple signal sig20. Since the frequency component of the multiple signal sig20 has a small amplitude in general, it is appropriately amplified by the frequency filter 111.

Since the trigger circuit in accordance with this embodiment is configured as mentioned above, it operates as explained in the following. It is assumed that the electric signal sin10 to be measured is a sine wave with a frequency of 10 MHz. It is assumed that the frequency filter 111 outputs only the frequency component near a frequency of 100 MHz.

When the electric signal sig10 is input, the harmonic signal generator 110 generates the harmonic signal sin11 having each frequency component of n ×10 MHz (n=1, 2, 3, . . . ). When this harmonic signal sigh is input into the frequency filter 111, only the component with a frequency of 100 MHz in the electric signal sin10 is appropriately amplified and then output. Thus, the multiple signal sig20 of the sine wave having a frequency of 100 MHz is obtained.

Subsequently, as in the case of the first embodiment, the multiple signal sig20 is input into the comparing portion 200 and converted into the square wave signal sig30 so as to be output therefrom. The square wave signal sig30 is input into the dividing portion 300 so as to be thinned out with a predetermined dividing ratio and output as the trigger signal sig40.

In this embodiment, as in the case of the above-mentioned first embodiment, the jitter of the trigger signal sig40 becomes $1/10$ of that in the conventional case, whereby a repetitive signal having a repetitive frequency smaller than that of the original electric signal sin10 can be obtained.

(Third Embodiment)

Figure 3:
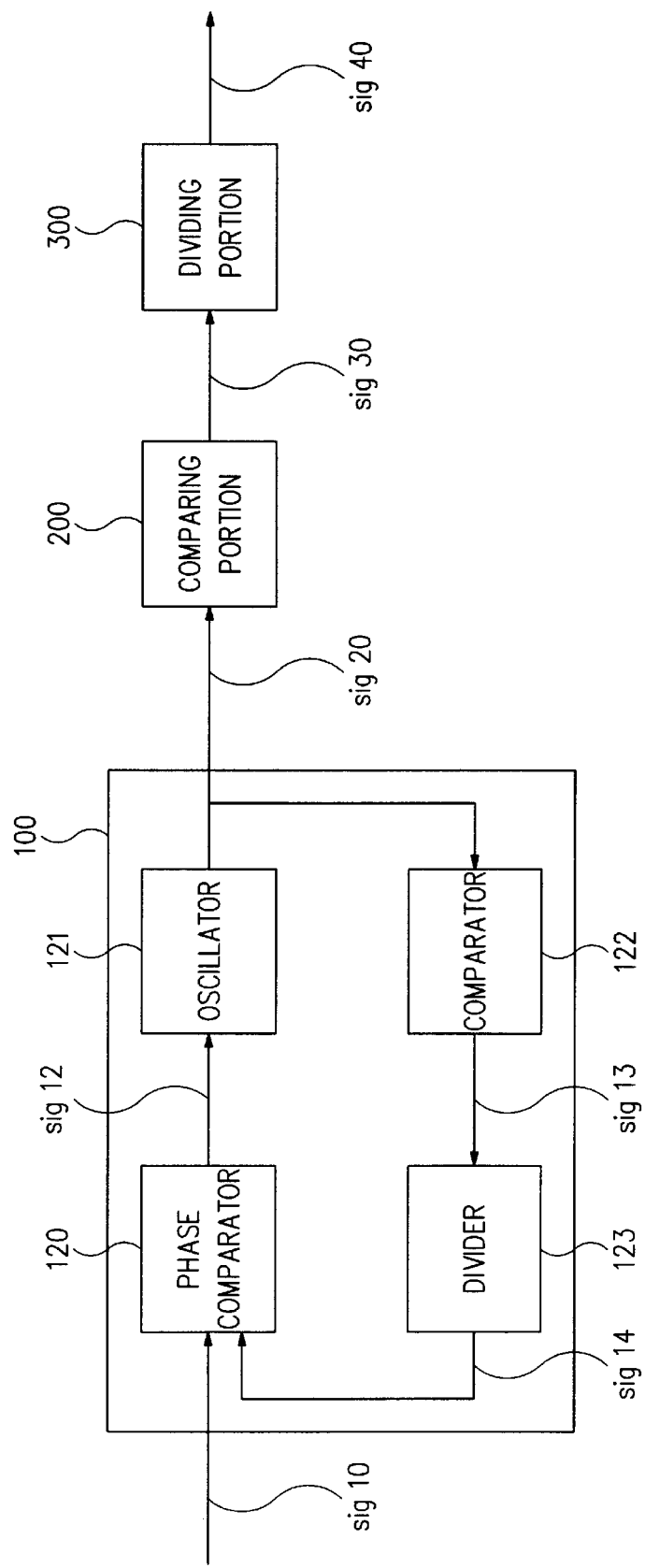
FIG. 3 is a block diagram of a trigger circuit in accordance with the third embodiment.

In the following, the third embodiment will be explained. In this embodiment, a PPL (Phase Locked Loop) circuit is used as a frequency multiplier. FIG. 3 is a block diagram of the trigger circuit in accordance with the third embodiment.

The trigger circuit in accordance with this embodiment comprises a frequency multiplying portion 100, a comparing portion 200, and a dividing portion 300 as in the case of the above-mentioned first embodiment, while its frequency multiplying portion 100 comprises (1) a phase comparator 120 which receives an electric signal sin10, which is an object to be measured, and a reference signal sig14 and detects the phase difference between the electric signal sin10 and reference signal sig14 so as to output a phase difference signal sig12, (2) an oscillator 121 which receives the phase difference signal sig12 and, based on the phase difference signal sig12, controls the frequency of a multiple signal sig20 so as to output the multiple signal sig20, (3) a comparator 122 which receives the multiple signal sig20, compares the magnitude of the multiple signal sig20 and that of a reference voltage, and, based on the result thereof, outputs a reference square wave signal sig13, and (4) a divider 123 which receives the reference square wave signal sig13 and divides the reference square wave signal sig13 with a predetermined dividing ratio so as to output the reference signal sig14.

When the electric signal sin10, which is an object to be measured, and the reference signal sig14, which is output from the divider 123, are input, the phase comparator 120 detects the phase difference between these electric signal sin10 and reference signal sig14 and outputs the phase difference signal sig12 which corresponds to this phase difference. The oscillator 121 is an oscillator which can variably control the frequency of the output signal. When the phase difference signal sig12 is input, the oscillator 121 controls the frequency of the output signal on the basis of the phase difference signal sig12 so as to output the multiple signal sig20. As the oscillator 121, a CL type oscillator composed of a capacitor and a coil as well as a crystal oscillator may be used. When the crystal oscillator is used, since its frequency accuracy is high and phase error is small, the multiple signal sig20 can be obtained as a stable sine wave.

The comparator 122 compares the magnitude of the input multiple signal sig20 and that of a reference voltage, and, based on the result thereof, outputs the reference square wave signal sig13. The divider 123 divides the input reference square wave signal sig13 with a ratio of the repetitive frequency of the electric signal sin10 to a desired frequency of the multiple signal sig20 so as to output the reference signal sig14, which is then input into the phase comparator 120.

Thus, in the frequency multiplying portion 100, a feedback circuit is formed by the phase comparator 120, oscillator 121, comparator 122, and divider 123. When the electric signal sin10, which is an object to be measured, is input, the frequency multiplying portion 100 generates the multiple signal sig20 having a frequency which is obtained when the repetitive frequency of the electric signal sin10 is multiplied by the inverse number of the dividing ratio of the divider 123.

Since the trigger circuit in accordance with this embodiment is configured as mentioned above, it operates as explained in the following. It is assumed that the electric signal sin10, which is an object to be measured, is a sine wave with a frequency of 10 MHz, for example. The oscillator 121 has a frequency which is controlled around a frequency of 100 MHz according to the phase difference signal sig12 and outputs the multiple signal sig20. The divider 123 divides the reference square wave signal sig13 so as to make it 1/10 and outputs the reference signal sig14.

At the time immediately after a power source is supplied to the phase comparator 120, the oscillator 121, the comparator 122, and the divider 123, the multiple signal sig20 output from the oscillator 121 does not have a desired frequency in general, while the reference signal sig14 input into the phase comparator 120 has frequency and phase different from those of the electric signal sin10. The phase comparator 120 detects the phase difference between the electric signal sin10 and the reference signal sig14 so as to output the phase difference signal sig12. The frequency of the signal output from the oscillator 121 is controlled by this phase difference signal sig12 so as to output the multiple signal sig20. In the comparator 122, this multiple signal sig20 is converted into the reference square wave signal sig13, which is then divided so as to become 1/10 by the divider 123 and thus the reference signal sig14 is output. This reference signal sig14 is input into the phase comparator 120 again and the phase difference between it and the electric signal sin10 is detected.

At the time when this feedback circuit attains its stable state, the phase difference signal sig12 output from the phase comparator 120 is constant, while the frequency of the multiple signal sig20 output form the oscillator 121 is constantly maintained with its value at 100 MHz which is obtained when 10 MHz, which is the frequency of the electric signal, is multiplied by 10, which is the inverse number of the dividing ratio of the divider 123. In this manner, the multiple signal sig20 having a predetermined frequency can be generated from the electric signal sin10.

Subsequently, as in the case of the first embodiment, the multiple signal sig20 is input into the comparing portion 200 and converted into the square wave signal sig30 so as to be output therefrom. The square wave signal sig30 is input into the dividing portion 300 so as to be thinned out with a predetermined dividing ratio and output as the trigger signal sig40.

In this embodiment, as in the case of the above-mentioned first embodiment, the jitter of the trigger signal sig40 becomes 1/10 of that in the conventional case. Also, a repetitive frequency smaller than that of the original electric signal sin10 can be obtained.

(Fourth Embodiment)

Figure 4:
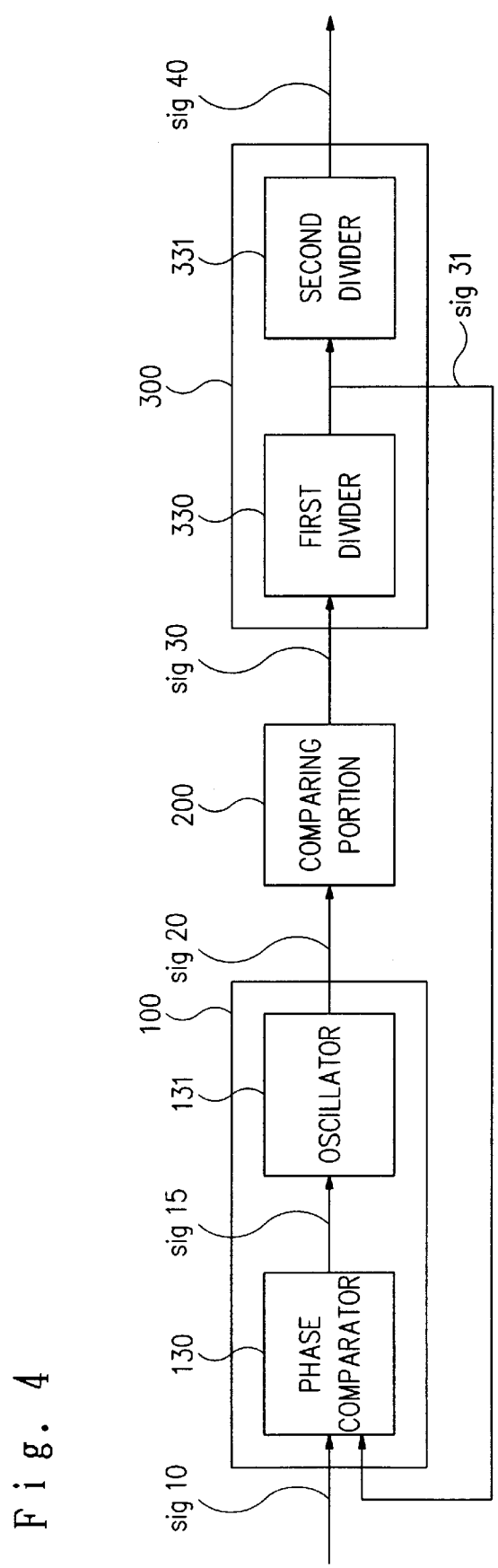
FIG. 4 is a block diagram of a trigger circuit in accordance with the fourth embodiment.

In the following, the fourth embodiment will be explained. Also, in this embodiment, a PPL (Phase Locked Loop) circuit is used as a frequency multiplier. FIG. 4 is a block diagram of the trigger circuit in accordance with the fourth embodiment.

The trigger circuit in accordance with this embodiment comprises a frequency multiplying portion 100, a comparing portion 200, and a dividing portion 300, as in the case of the above-mentioned first embodiment, and is used when the repetitive frequency of the trigger signal to be obtained is smaller than that of the electric signal which is an object to be measured. Its frequency multiplying portion 100 comprises (1-1) a phase comparator 130 which receives an electric signal sin10, which is an object to be measured, and a reference signal sig31 and detects the phase difference between the electric signal sin10 and reference signal sig31 so as to output a phase difference signal sig15 and (1-2) an oscillator 131 which receives the phase difference signal sig15 and, based on the phase difference signal sig15, controls the frequency of a multiple signal sig20 so as to output the multiple signal sig20. The dividing portion comprises (2-1) a first divider 330 which receives a square wave signal sig30 and divides the square wave signal sig30 with a predetermined dividing ratio so as to output the reference signal sig31 and (2-2) a second divider 331 which receives the reference signal sig31 and divides the reference signal sig31 with a predetermined dividing ratio so as to output a trigger signal sig40.

When the electric signal sin10, which is an object to be measured, and the reference signal sig31, which is output from the first divider 330, are input, the phase comparator 130 detects the phase difference between the electric signal sin10 and reference signal sig31 and outputs the phase difference signal sig15 which corresponds to this phase difference. The oscillator 131 is an oscillator which can variably control the frequency of the output signal. When the phase difference signal sig15 is input, the oscillator 131 controls the frequency of the output signal on the basis of the phase difference signal sig15 so as to output the multiple signal sig20.

When the square wave signal sig30 is input, the first divider 330 divides the square wave signal sig30 with a ratio of the repetitive frequency of the electric signal sin10 to a desired frequency of the multiple signal sig20 so as to output the reference signal sig31. This reference signal sig31 is input into the second divider 331 and the phase comparator 130. When the reference signal sig31 is input, the second divider 331 divides the reference wave signal sig31 with a ratio of the repetitive frequency of the electric signal sin10 to a desired frequency of the trigger signal sig40 so as to output the trigger signal sig40.

Thus, the phase comparator 130, the oscillator 131, the comparing portion 200, and the first divider 330 form a feedback circuit which receives the electric signal sin10, which is an object to be measured, and, in a stable state, generates and outputs the reference signal sig31 having a frequency identical to the repetitive frequency of the electric signal sin10.

Since the trigger circuit in accordance with this embodiment is configured as mentioned above, it operates as explained in the following. It is assumed that the electric signal sin10, which is an object to be measured, is a sine wave with a frequency of 10 MHz, for example. The oscillator 131 has a frequency which is controlled around a frequency of 100 MHz according to the phase difference signal sig15 and outputs the multiple signal sig20. The first divider 330 divides the square wave signal sig30 so as to make it $1/10$ and outputs the reference signal sig31. The second divider 331 divides the reference signal sig31 so as to make it $1/10$ and outputs the trigger signal sig40.

At the time immediately after a power source is supplied to the phase comparator 130, the oscillator 131, the comparing portion 200, and the first divider 330, the reference signal sig31 output from the first divider 330 in general does not only have a stable repetitive frequency but also frequency and phase different from those of the electric signal sin10. The phase comparator 130 detects the phase difference between the electric signal sin10 and the reference signal sig31 so as to output the phase difference signal sig15. The frequency of the signal output from the oscillator 131 is controlled by this phase difference signal sig15 so as to output the multiple signal sig20. This multiple signal sig20 is input into the comparing portion 200 and converted into the square wave signal sig30 having the repetitive frequency identical to that of the multiple signal sig20. The square wave signal sig30 is input into the first divider 330 and divided so as to become $1/10$ and thus the reference signal sig31 is output. This reference signal sig31 is input into the phase comparator 130 again and the phase difference between it and the electric signal sin10 is detected.

At the time when this feedback circuit attains its stable state, the phase difference signal sig15 output from the phase comparator 130 is constant, while the frequency of the multiple signal sig20 output from the oscillator 131 is constantly maintained with its value at 100 MHz which is obtained when 10 MHz, which is the frequency of the electric signal, is multiplied by 10, which is the inverse number of the dividing ratio of the first divider 330. Also, the reference signal sig31 output from the first divider 330 has a repetitive frequency identical to that of the electric signal sin10 which is an object to be measured. In this manner, the multiple signal sig31 having a repetitive frequency identical to that of the electric signal sin10 can be generated. Then, the reference signal sig31 is input into the second divider 331 and divided so as to become $1/10$ and output as the trigger signal sig40.

In this embodiment, as in the case of the above-mentioned first embodiment, the jitter of the trigger signal sig40 becomes $1/10$ of that in the conventional case. Also, a repetitive frequency smaller than that of the original electric signal sin10 can be obtained.

(Fifth Embodiment)

Figure 5:
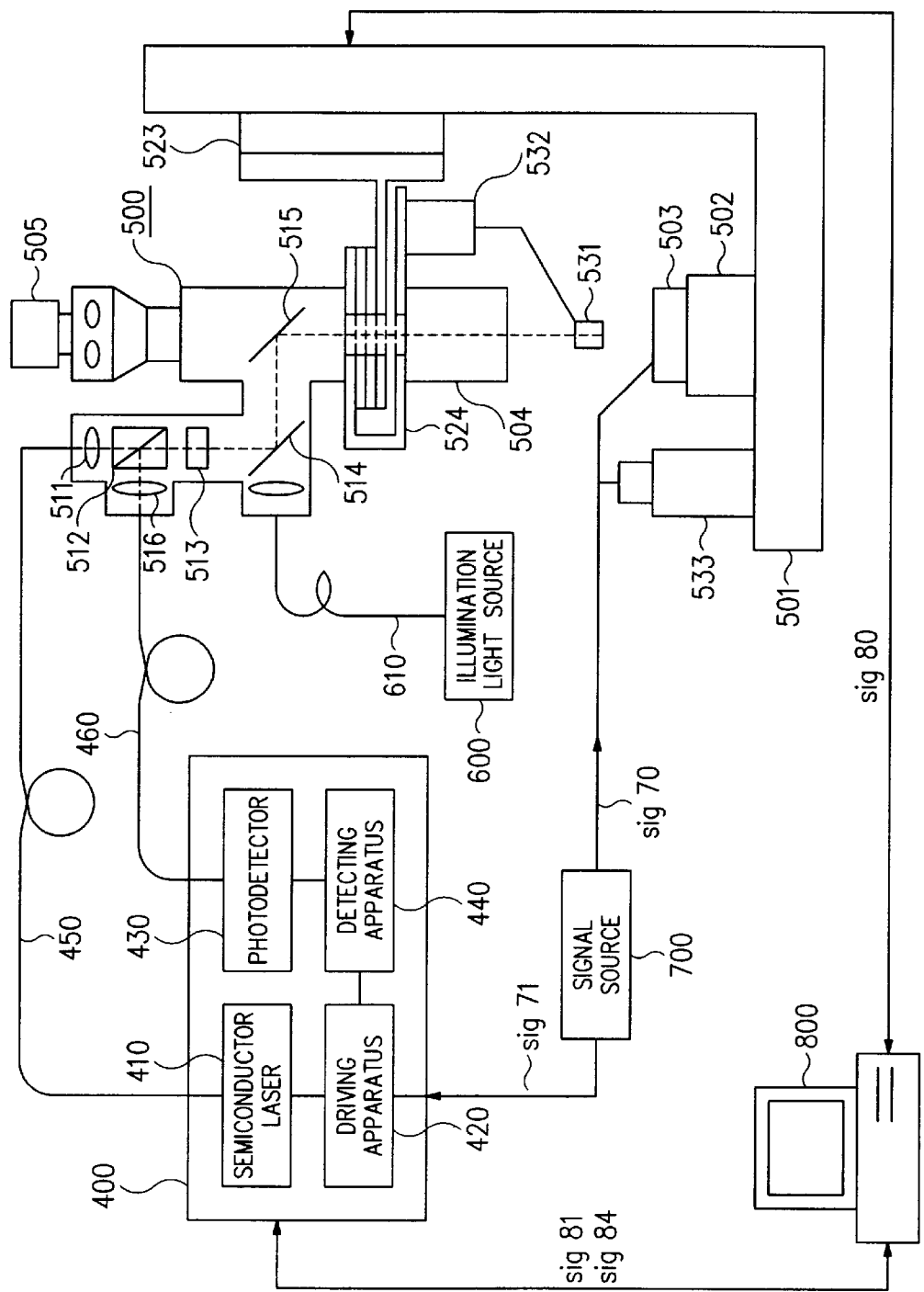
FIG. 5 is an overall configurational view of an electric field measuring apparatus in accordance with the present invention.
Figure 6:
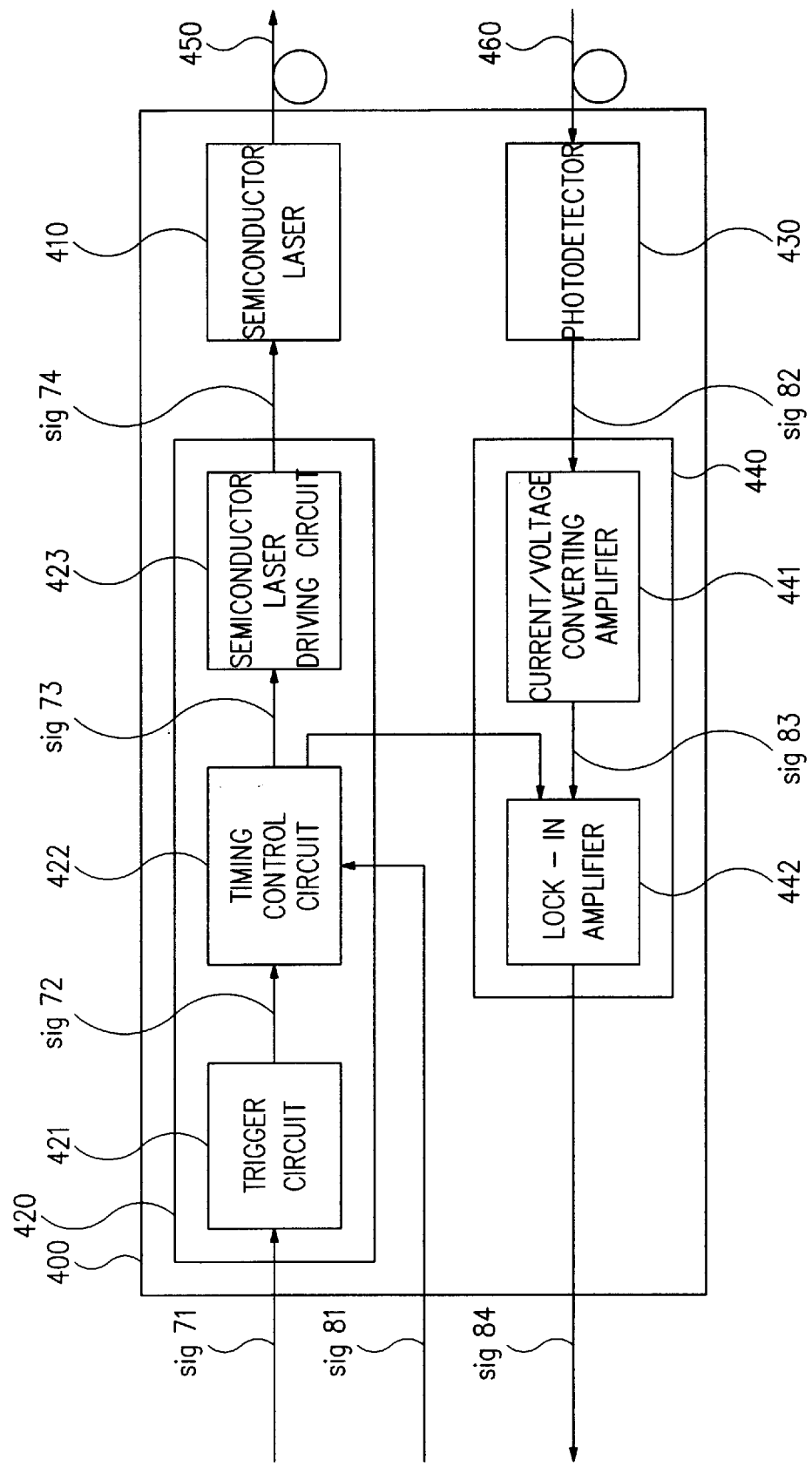
FIG. 6 is a block diagram of a measuring apparatus in an electric field measuring apparatus in accordance with the present invention.

In the following, the fifth embodiment will be explained. This embodiment refers to an example in which a trigger circuit in accordance with the present invention is applied to an electric field measuring apparatus (e.g., The Transactions of the Institute of Electrical Engineers of Japan, c, Vol. 111-C, pp. 145–154, April issue, 1991). FIG. 5 is an overall configurational view of the electric field measuring apparatus in accordance with the present invention. FIG. 6 is a block diagram of the electric field measuring apparatus in accordance with the present invention.

The electric field measuring apparatus in accordance with this embodiment mainly comprises (1) a measuring apparatus 400 which generates probe light and supplies it to a microscope 500 by way of an input optical fiber 450, while measuring, with a predetermined timing, the intensity of the reflected probe light which has arrived there from the microscope 500 by way of an output optical fiber 460, (2) the microscope 500 comprising an electric field sensor (probe) 531 which is arranged near an object 503 and detects the electric potential of a surface of the object 503 to be measured, an optical system for introducing the probe light to the electric field sensor 531, an optical system for observing the surface of the object 503 to be measured, XYZ stages for moving these optical systems, and so on, (3) an illumination light source 600 which generates illumination light for observing the surface of the object 503 to be measured and supplies it to the microscope 500 by way of a bundle fiber 610, (4) a signal source 700 which supplies a driving signal sig70 to the object 503 to be measured, while supplying a reference signal sig71, which is synchronized with the driving signal sig70, to the measuring apparatus 400, (5) a control computer 800 which controls the timing for generating the probe light and timing for measuring the reflected probe light arriving from the microscope 500 in the measuring apparatus 400, controls the position of the electric field sensor 531 of the microscope 500, and collects and analyzes the results of measurement in the measuring apparatus 400.

The measuring apparatus 400 comprises (1) a semiconductor laser 410 for generating the probe light, (2) a driving apparatus 420 for lighting the semiconductor laser 410 with a predetermined timing, (3) a photodetector 430 which outputs an electric current signal corresponding to the intensity of the reflected probe light arriving from the microscope 500 by way of the output optical fiber 460, and (4) a detecting apparatus 440 which converts the electric current signal output from the photodetector 430 into a voltage signal and outputs a voltage signal value synchronized with a predetermined timing.

The driving apparatus 420 of the measuring apparatus 400 comprises (1) a trigger circuit 421 for generating a trigger signal, (2) a timing control circuit 422 which, according to an instruction from the control computer 800 and based on the trigger signal, outputs a lighting timing signal indicative of the lighting timing of the semiconductor laser 410, and (3) a semiconductor laser driving circuit 423 which, according to the lighting timing signal output from the timing control circuit 422, outputs a lighting signal for subjecting the semiconductor laser 410 to pulse emission.

The detecting apparatus 440 of the measuring apparatus 400 comprises (1) a current/voltage converting amplifier 441 which converts the electric current signal output from the photodetector 430 into a voltage signal and amplifies it and (2) a lock-in amplifier 442 which outputs a voltage signal value synchronized with a predetermined timing in the voltage signal output from the current/voltage converting amplifier 441.

Figure 8:
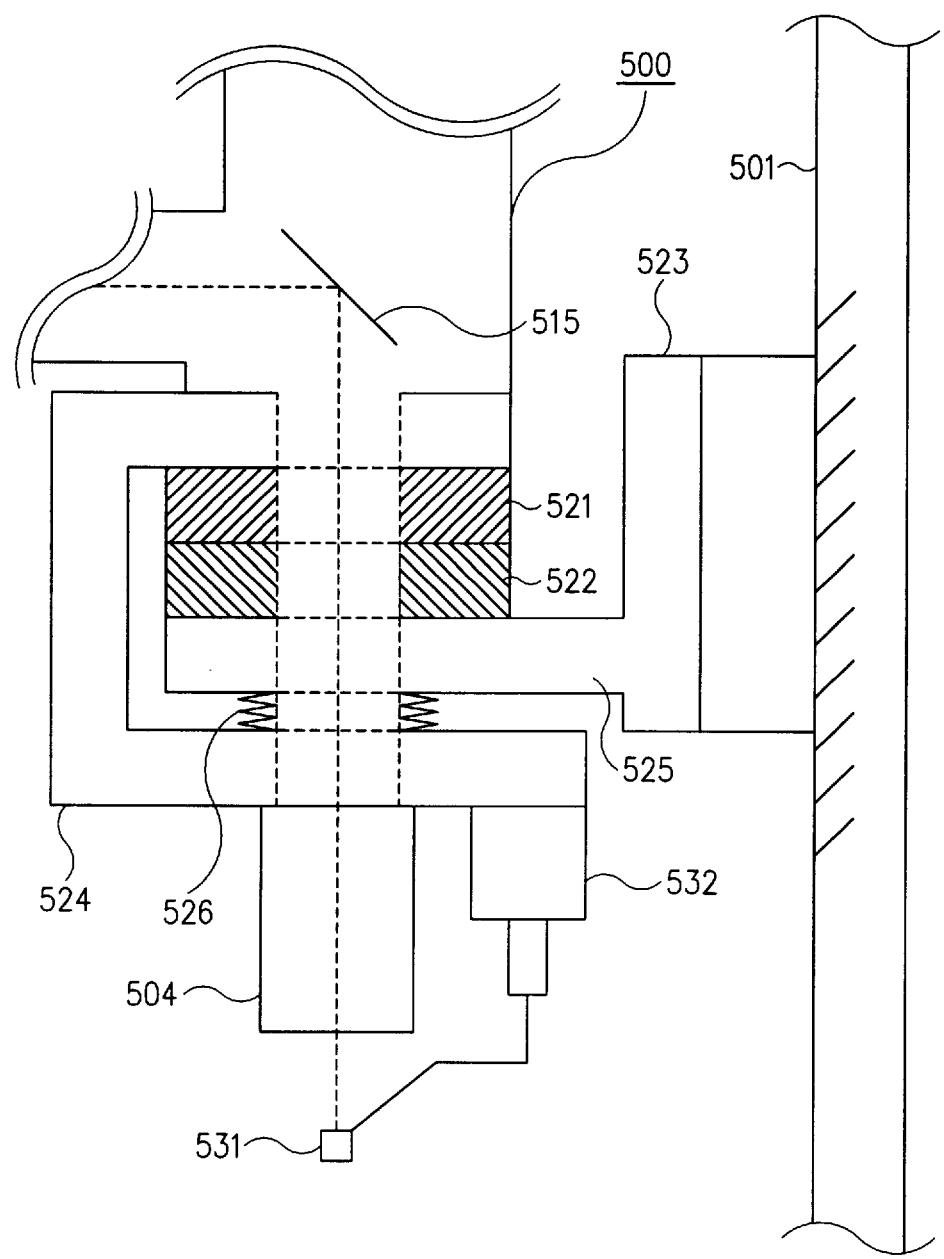
FIG. 8 is a configurational sectional view of an electric field measuring apparatus in accordance with the present invention near its XYZ stages.
Figure 9:
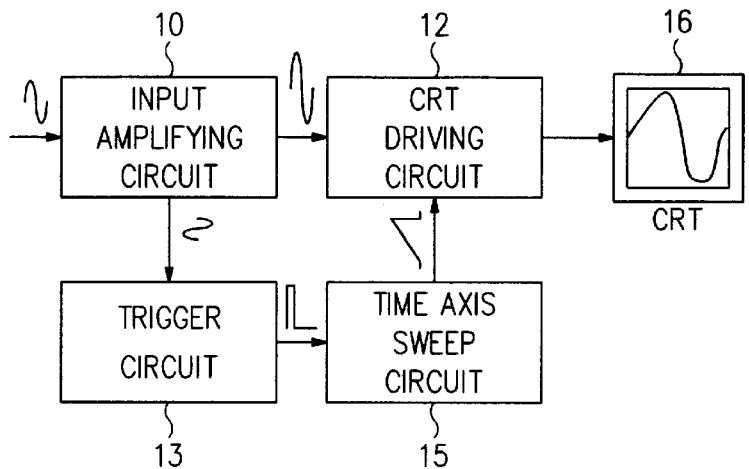
FIG. 9 is a block diagram of an analog oscilloscope.
Figure 10:
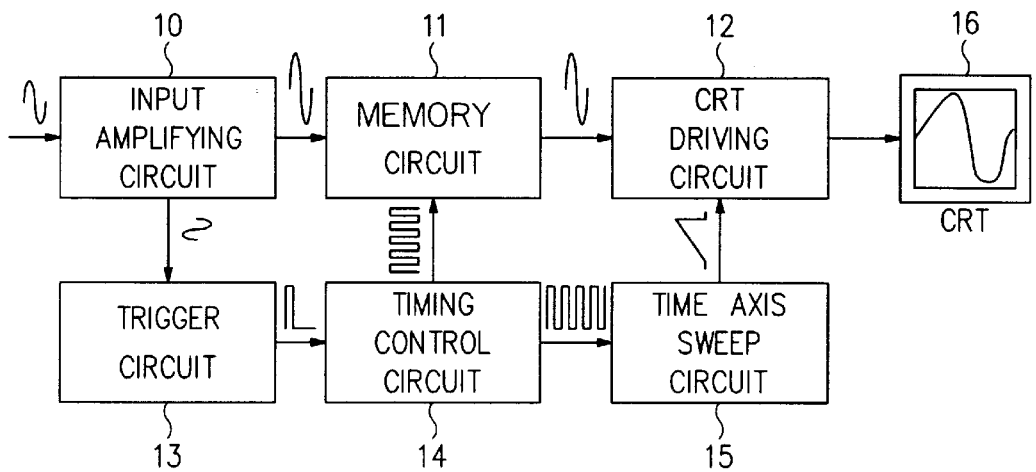
FIG. 10 is a block diagram of a digital oscilloscope.

The microscope 500 comprises (1) a collimator lens 511 which converts the probe light, which has arrived there from the measuring apparatus 400 by way of the input optical fiber 450, into collimated light, (2) a polarizing beam splitter (PBS) 512 which receives this collimated light and transmits only its linearly polarized component therethrough, (3) a wave plate 513 which supplies a phase difference corresponding to the direction of polarization to the probe light transmitted through the PBS 512, (4) dichroic mirrors (DCMS) 514 and 515 for reflecting the probe light transmitted through the wave plate 513, (5) an objective lens 504 which transmits the probe light reflected by the DCM 515 or the like, (6) the electric field sensor 531 which receives the probe light having been transmitted through the objective lens 504 to reach there and has an optical characteristic which can change in response to a local electric field of the surface of the object 503 to be measured, (7) a sensor stage 532 for moving the electric field sensor 531, (8) a camera 505 which observes, by way of the objective lenses 504 and the DCM 515, the surface of the object 503 to be measured, and (9) an X stage 521, an Y stage 522, and a Z stage 523 which move the collimator lens 511, the PBS 512, the wave plate 513, the DCMs 514 and 515, the objective lens 504, the electric field sensor 531, the sensor stage 532, and the camera 505 unitedly (cf. FIG. 8).

The signal source 700 supplies the driving signal sig70 to a predetermined electrode of the object 503 to be measured (e.g., integrated circuit) which is disposed on a sample stage 502 by way of an electrode stage 533. The driving signal sig70 supplied to the predetermined electrode of the object 503 to be measured becomes an input signal to the object 503 to be measured. In response thereto, the state of the object 503 to be measured changes, whereby the electric field emerging thereon varies. Also, the signal source 700 supplies the reference signal sig71 to the measuring apparatus 400. This reference signal sig71 is a signal synchronized with the driving signal sig70 and becomes a standard signal for the timing for generating the probe light and timing for measuring the intensity of the reflected probe light arriving from the microscope 500. As the signal source, a synthesizer (e.g., HP-83620 manufactured by Hewlett-Packard Company) is used.

The semiconductor laser 410 and driving apparatus 420 of the measuring apparatus 400 constitute a probe light source for generating the probe light. In the driving apparatus 420, the trigger circuit 421 generates a trigger signal sig72 on the basis of the reference signal sig71 from the signal source 700. This trigger circuit 421 has configuration and operation similar to those of one of the foregoing first to fourth embodiments. According to the lighting timing control signal sig81 output from the control computer 800 and on the basis of the trigger signal sig72, the timing control circuit 422 outputs a lighting timing signal sig73 indicative of the lighting timing of the semiconductor laser 410. According to the lighting timing signal sig73 output from the timing control circuit 422, the semiconductor laser driving circuit 423 drives the semiconductor laser 410 so as to subject it to pulse emission.

In order for the electric field sensor 531 to accurately measure the electric field of the surface of the object 503 to be measured, it is necessary for the semiconductor laser 410 to generate pulse emission with a favorable response according to the lighting timing signal sig73. In order for the semiconductor laser 410 to generate short pulse light, the semiconductor laser driving circuit has to generate a driving signal sig74 with a high current and a short duration pulse. Accordingly, as the semiconductor laser driving circuit 423, a circuit using an avalanche transistor (e.g., ZTX 415 of Zetex Corp.) is preferable.

Figure 7:
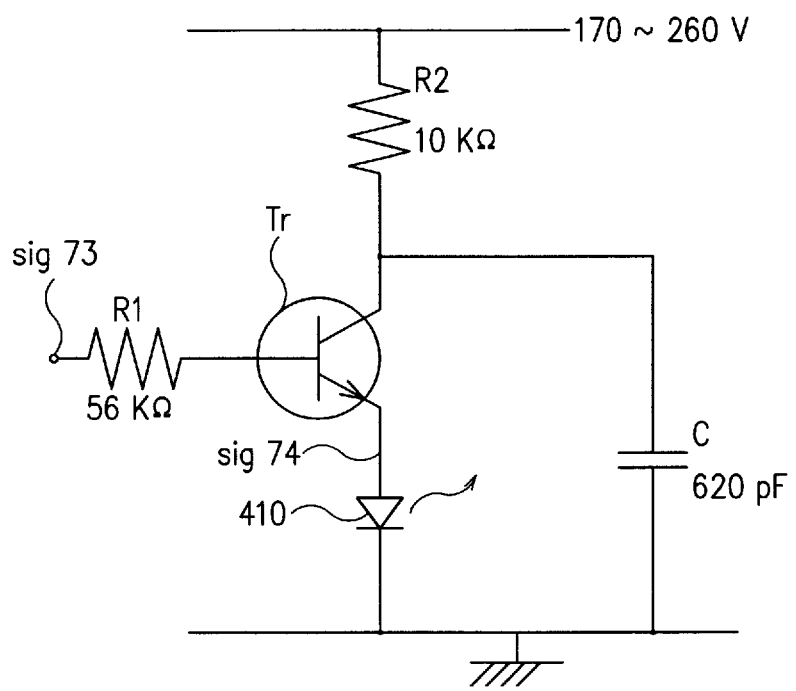
FIG. 7 is an example of a circuit diagram of a semiconductor laser driving circuit in a measuring apparatus in an electric field measuring apparatus in accordance with the present invention.

FIG. 7 is an example of a circuit diagram of the semiconductor laser driving circuit within the measuring apparatus in the electric field measuring apparatus in accordance with the present invention. To the collector terminal of an avalanche transistor Tr, a high voltage of 170 to 260 V is applied by way of a resistor R2 having a resistance value of 10 kΩ. The emitter terminal of the avalanche transistor Tr is connected to the anode terminal of the semiconductor laser 410 whose cathode terminal is grounded. The lighting timing signal sig73 output from the timing control circuit 422 is input into the base terminal of the avalanche transistor Tr by way of a resistor R1 having a resistance value of 56 kΩ. When the lighting timing signal sig73 is at H level, a low resistance state is established between the collector and emitter terminals of the avalanche transistor Tr, whereby an electric current (driving signal sig74) flows into the semiconductor laser 410 so as to make the latter emit the probe light in a pulse manner. Here, when an avalanche transistor is used in the semiconductor laser driving circuit 423, due to its characteristics, the repetitive frequency cannot be set high. Accordingly, the reference signal sig71 arriving from the signal source 700 is divided in the trigger circuit 421 so as to output the trigger signal sig72, whose repetitive frequency is used for driving the semiconductor laser 410.

The photodetector 430 and detecting apparatus 440 in the measuring apparatus 400 constitute a light detecting portion for measuring the reflected probe light arriving from the microscope 500. The photodetector 430 receives the reflected probe light, which has arrived there from the microscope 500 by way of the output optical fiber 460, and outputs an electric current signal sig82 corresponding to the optical intensity thereof. The detecting apparatus 440 of the measuring apparatus 400 receives the electric current signal sig82 output from the photodetector 430 and outputs a voltage signal sig83 corresponding to this electric current signal sig82. The lock-in amplifier 442 receives the voltage signal sig83 output from the current/voltage converting amplifier 441 and outputs, to the control computer 800, a data signal sig84 synchronized with the timing indicated by the control computer 800 in this voltage signal sig83. The collimator lens 511 of the microscope 500 converts the probe light, which has arrived there from the measuring apparatus 400 by way of the input optical fiber 450, into collimated light so as to be introduced into the microscope 500.

When the collimated light arriving from the collimator lens 511 is incident, the PBS 512 only transmits a linearly polarized component, which is polarized in a certain direction, therethrough. Also, when the reflected probe light, which has arrived there after being reflected by the electric field sensor 531 and passing through the wave plate 513, is incident, the PBS 512 only transmits a polarized component, which is polarized in a certain direction, therethrough; while reflecting, toward the output optical fiber 460, a linearly polarized component which is polarized in a direction orthogonal to the above-mentioned direction. Thus reflected light component is input, by way of the condenser lens 516, into an inlet end of the output optical fiber 460.

The wave plate 513 is a birefringence plate which supplies a phase difference corresponding to an ⅛ wavelength optical path difference to the probe light transmitted therethrough. The probe light is transmitted through the wave plate 513 again after being reflected by the bottom surface of the electric field sensor 531. As the probe light passes through the wave plate 513 to and fro, a phase difference corresponding to a ¼ -wavelength optical path difference is generated.

The DCMs 514 and 515 reflect the probe light transmitted through the wave plate 513 so as to make it incident on the objective lens 504, while guiding the reflected probe light from the electric field sensor 531 toward a direction opposite to the incident direction. The objective lens 504 transmits the probe light reflected by the DCM 515 toward the electric field sensor 531, while guiding the reflected probe light from the electric field sensor 531 toward a direction opposite to the incident direction.

The electric field sensor 531 comprises an electro-optic material which changes its optical characteristic such as refractive index when the voltage is applied to the material (e.g., crystal and liquid crystal materials such as $LiNbO_3$, $LiTaO_3$, GaAs, CdTe, ZnTe, and $KTiOPO_4$), while a reflective mirror (not depicted) made of a dielectric multilayer film is formed on the bottom surface thereof. The electric field sensor 531 is disposed or scanned in contact with or in close to the surface of the object 503 to be measured, while its refractive index changes in response to the electric field of the surface of the object 503 to be measured. The probe light which has arrived there through the objective lens 504 enters the electric field sensor 531 from the upper surface thereof and then passes through the electro-optic material. Thereafter, it is reflected by the reflective mirror at the bottom surface of the electric field sensor 531 and then transmitted through the electro-optic material again so as to reach the upper surface of the electric field sensor 531. At this time, the state of polarization of the probe light changes in response to the electric field at the position where the electric field sensor 531 is disposed. The sensor stage 532 receives a control signal sig80 output from the control computer 800 and moves the electric field sensor 531 in response thereto. Also, the control signal sig80 controls the XYZ stages of the electric field measuring apparatus.

By way of the objective lens 504 and the DCM 515, the camera 505 observes the surface of the object 503 to be measured. Illumination light therefor is output from the illumination apparatus 600 and, by way of the bundle fiber 610, transmitted through the DCM 514, partially reflected by the DCM 515, and then transmitted through the objective lens 504 to irradiate the surface of the object 503 to be measured. An image of the surface of the object 503 to be measured is transmitted through the objective lens 504 and then partially transmitted through the DCM 514 to reach the camera 505.

FIG. 8 is a configurational sectional view of the electric field measuring apparatus in accordance with the present invention near its XYZ stages. Each of the X stage 521, Y stage 522, and Z stage 523 unitedly moves the main body of the microscope 500 comprising the collimator lens 511, PBS 512, wave plate 513, DCMs 514 and 515, and the like, the objective lens 504, the electric field sensor 531, and the sensor stage 532 by using a supporting device 524. The Z stage 523 is attached to a frame 501 so as to be moved in a direction orthogonal to the surface of the object 503 to be measured. The X stage 521 and the Y stage 522 are attached onto a beam 525 extending from the Z stage 523 so as to be respectively moved in two directions which are orthogonal to each other and in parallel to the surface of the object 503 to be measured. The supporting device 524 unites the objective lens 504, the electric field sensor 531, the sensor stage 532, and the main body of the microscope 500 together. It is fixed onto the X stage 521 and the Y stage 522 and moved in XY directions by the X stage 521 and the Y stage 522. An opening is formed at the center portion of each of the X stage 521, Y stage 522, supporting device 524, and beam 525 such that the probe light and illumination light pass therethrough. Since load acts on the X stage 521 and the Y stage 522 only in the directly downward direction without any moment (tilting force) applied thereto, it is sufficient for the X stage 521 and Y stage 522 to have small sizes, whereby a high accuracy can be easily attained. In the space between the supporting device 524 and the Z stage 523, a bellows 526 is disposed so as to prevent disturbance light from entering the optical paths of the probe light and illumination light.

The control computer 800 controls the probe light generating timing at the measuring apparatus 400 and the measuring operation of the reflected probe light arriving from the microscope 500 by the lock-in amplifier 442. Namely, the control computer 800 supplies the lighting timing control signal sig81 to the timing control circuit 422. By using the output time of the trigger signal sig72 output from the trigger circuit 421 as a reference, the timing control circuit 422 outputs the lighting timing signal sig73 after the time indicated by the lighting timing control signal sig81. According to the lighting timing signal sig73, the semiconductor laser driving circuit 423 makes the semiconductor laser 410 emit light. The voltage signal sig83 output from the current/voltage converting amplifier 441 as the photodetector 430 detects the returning reflected probe light reflected by the electric field sensor 531 is measured by the lock-in amplifier 442 in synchronization with the lighting timing signal sig73 indicated by the control computer 800. The resulting data signal sig84 is collected and analyzed. Further, the control controller 800 controls the sensor stage 532 of the microscope 500 so as to move the electric field sensor 531 to a predetermined position on the surface of the object 503 to be measured. Also, the control computer 800 controls the XYZ stages of the electric field measuring apparatus so as to move the microscope 500, electric field sensor 531, and the like on the object 503 to be measured.

Since the electric field measuring apparatus in accordance with this embodiment is configured in the foregoing manner, it operates as mentioned below so as to measure the electric field of the surface of the object 503 to be measured.

The driving signal sig70 output from the signal source 700 is added, by way of the electrode stage 533, to a predetermined electrode of the object 503 to be measured, so as to become an input signal for the object 503 to be measured. At the same time, the reference signal sig71 synchronized with the driving signal sig 70 is transmitted from the signal source 700 to the measuring apparatus 400.

When the reference signal sig71 is input into the trigger circuit 421 of the measuring apparatus 400, as in the case of the above-mentioned first to fourth embodiments, the reference signal sig71 is converted at the frequency multiplying portion into a multiple signal whose repetitive signal has been multiplied, converted at the comparing portion into a square wave signal, and then divided at the dividing portion such that the trigger signal sig72 with little jitter is output. When the trigger signal sig72 is input into the timing control circuit 422, according to the instruction of the lighting timing control signal sig81 output from the control computer 800, the lighting timing signal sig73 is output at a predetermined time based on the trigger signal sig72. When the lighting timing signal sig73 is input into the semiconductor laser driving circuit 423, the semiconductor laser 410 outputs the probe light only during the time in which the lighting timing signal sig72 is at H level.

The probe light is guided through the input optical fiber 450 and then turned into collimated light by the collimator lens 511 of the microscope 500 so as to be introduced into the microscope 500. Of the collimated light output from the collimator lens 511, only a component linearly polarized in a certain direction is transmitted through the PBS 512, transmitted through the wave plate 513, reflected by the DCMs 514 and 515, transmitted through the openings of the X stage 521 and Y stage 522, and then transmitted through the objective lens 504 to reach the electric field sensor 531.

According to the control signal sig80 from the control computer, the sensor stage 532 places the electric field sensor 531 at a predetermined position on the surface of the object 503 to be measured. The state of polarization of the probe light arrived at this electric field sensor 531 changes according to the electric field existing at the position where the electric field sensor 531 is disposed during the time by which the probe light travels through the electro-optic material to and fro as being reflected by the reflective mirror at the bottom surface of the electric field sensor 531.

The reflected probe light reflected by the reflective mirror at the bottom surface of the electric field sensor 531 is transmitted through the objective lens 504, transmitted through the openings of the X stage 521 and Y stage 522, reflected by the DCMs 515 and 514, and then transmitted through the wave plate 513. As the probe light travels through the wave plate 513 to and fro, the initially linearly polarized probe light, after having traveled through the wave plate 513 to and fro, becomes elliptically polarized light having an ellipticity corresponding to the electric field applied to the electro-optic material of the electric field sensor 531. Of the reflected probe light thus elliptically polarized, a component linearly polarized in a direction orthogonal to the incident direction is reflected by the PBS 512 so as to enter the output optical fiber 460 by way of the condenser lens 513.

The reflected probe light which has entered the output optical fiber 460 reaches the measuring apparatus 400 and is photoelectrically converted by the photodetector 430 such that the current signal sig82 is output. The current/voltage converting amplifier 441 converts the current signal sig82 into the voltage signal sig83, which is then measured by the lock-in amplifier 442 in synchronization with the timing indicated by the control computer 800 so as to be transmitted to the latter. Thus, the electric field of the surface of the object 503 to be measured can be determined.

Then, from the control signal sig80 supplied to the sensor stage 532 and the XYZ stages and the data signal sig84 output from the lock-in amplifier 442, the control computer 800 can determine the electric field distribution in the surface of the object 503 to be measured. Also, by supplying the lighting timing control signal sig81 indicative of the timing for lighting the semiconductor laser 410 to the timing control circuit 422, the control computer 800 can measure the change in electric field of the surface of the object 503 to be measured, namely, voltage waveform.

Since the electric field measuring apparatus in accordance with this embodiment uses, as the trigger circuit 421, one of the trigger circuits mentioned in the foregoing first to fourth embodiments, this trigger circuit 421 outputs the trigger signal sig72 having little jitter with an accurate timing from the time at which the driving signal sig70 is generated. Accordingly, the difference between time at which the driving signal sig70 applied from the signal source 700 to the object 503 to be measured is generated and the time at which the probe light output from the semiconductor laser 410 is generated becomes constant or, if not, is restricted to a narrow range, therefore the electric field of the surface of the object 503 to be measured can be measured with a high accuracy in terms of time.

Without being restricted to the foregoing embodiments, the present invention can be modified in various manners. For example, the ratio of frequency multiplication at the frequency multiplying portion may be any ratio, without being restricted to the above-mentioned 10 times. Also, the dividing ratio of the dividing portion may be any ratio, without being restricted to the above-mentioned 1/100. Though the repetitive frequency of the trigger signal explained in the foregoing embodiment is smaller than the repetitive frequency of the electric signal input into the trigger circuit, without being restricted thereto, it may be greater than the latter. The configuration of the dividing portion is not restricted to the foregoing embodiments; other types of counters such as Johnson counter may be used.

As explained in detail in the foregoing, the trigger circuit in accordance with the present invention comprises a frequency multiplying portion which receives an electric signal to be measured and multiplies its repetitive frequency so as to output a multiple signal, a comparing portion which receives this multiple signal and outputs a square wave signal corresponding to its value, and a dividing portion which divides the square wave signal so as to output a trigger signal. Accordingly, even when a noise component is superposed on the multiple signal, since the time change velocity of the multiple signal is faster than that of the electric signal to be measured, the square wave signal output from the comparing portion has smaller jitter, whereby the trigger signal output from the dividing portion has smaller jitter as well. Further, the trigger signal can have a repetitive frequency lower than that of the electric signal to be measured. Accordingly, when the trigger circuit of the present invention is used in an electric signal waveform measuring apparatus such as an oscilloscope, the waveform of the electric signal to be measured can be measured with a high accuracy in terms of time in synchronization therewith, while using a lower repetitive frequency for displaying the electric signal waveform in the electric signal waveform measuring apparatus thereby reducing power consumption and heat generation.

Also, since the electric field measuring apparatus in accordance with the present invention comprises a frequency multiplying portion which receives a reference signal which is identical to or synchronized with a driving signal supplied to an object to be measured and multiplies the repetitive frequency of the reference signal so as to output a multiple signal, a comparing portion which receives the multiple signal and outputs a square wave signal corresponding to its value, and a dividing portion which divides the square wave signal, such that probe light is emitted on the basis of the trigger signal having little jitter output from this trigger circuit, the electric field of the object to be measured can be measured with a high accuracy in terms of time.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

The basic Japanese Application No. 204415/1995 filed on Aug. 10, 1995 is hereby incorporated by reference.

What is claimed is:

1. A trigger circuit comprising:

a frequency multiplying portion for receiving an input signal having a first repetitive frequency and for frequency multiplying the input signal to produce a frequency multiplied signal having a magnitude which varies cyclically at a second repetitive frequency which is higher than the first repetitive frequency;

a comparing portion connected to said frequency multiplying portion for receiving the frequency multiplied signal from said frequency multiplying portion and for comparing the magnitude of the frequency multiplied signal with a fixed reference signal magnitude in order to produce a square wave signal; and a frequency dividing portion connected to said comparing portion for receiving the square wave signal and for frequency dividing the square wave signal to produce a trigger signal.

2. A trigger circuit according to claim 1, wherein said frequency multiplying portion comprises:

a phase comparator which receives said input signal and a reference signal and detects a phase difference between said input signal and said reference signal to as to output a phase difference signal;

an oscillator which receives said phase difference signal and, based on said phase difference signal, controls the repetitive frequency of said frequency multiplied signal so as to output said frequency multiplied signal;

a comparator which receives said frequency multiplied signal and outputs a reference square wave signal, said reference square wave signal having a first output level when said frequency multiplied signal has a value greater than a reference value while otherwise having a second output level which is different from said first output level; and a divider which receives said reference square wave signal and divides said reference square wave signal with a ratio of said second repetitive frequency to said third repetitive frequency so as to output said reference signal.

3. A trigger circuit according to claim 1, wherein the trigger signal has a third repetitive frequency lower than said first repetitive frequency, wherein said frequency multiplying portion comprises:

a phase comparator which receives said input signal and a reference signal and detects a phase difference between said input signal and said reference signal so as to output a phase difference signal; and an oscillator which receives said phase difference signal and, based on said phase difference signal, controls the second repetitive frequency of said frequency multiplied signal so as to output said frequency multiplied signal, and wherein said dividing portion comprises:

a first divider which receives said square wave signal and divides said square wave signal with a ratio of said first repetitive frequency to said second repetitive frequency so as to output said reference signal; and a second divider which receives said square wave signal and divides said reference square wave signal with a ratio of said third repetitive frequency to said first repetitive frequency so as to output said trigger signal.

4. A trigger circuit according to claim 1 wherein said frequency multiplying portion comprises:

a harmonic signal generator that generates, from the input signal, a harmonic signal having a harmonic frequency component at the second repetitive frequency; and a frequency filter that receives the harmonic signal and passes substantially only the harmonic frequency component as the frequency multiplied signal.

5. A trigger circuit according to claim 1 wherein said frequency multiplying portion multiplies the input signal frequency by a constant multiplying factor to produce the frequency multiplied signal.

6. A trigger circuit according to claim 5 wherein the square wave signal has a first repetition rate and the trigger signal has a second repetition rate lower than the first repetition rate.

7. A trigger circuit according to claim 1 wherein the square wave signal has a first repetition rate and the trigger signal has a second repetition rate lower than the first repetition rate.

* * * * *